United States Patent [19]

Mamodaly et al.

[11] Patent Number: 4,727,338

[45] Date of Patent: Feb. 23, 1988

[54] HYPERFREQUENCY OSCILLATOR OPERATING IN THE MILLIMETRIC BAND

[75] Inventors: Narguise Mamodaly, Paris; Alain Bert, Gif Sur Yvette, both of France

[73] Assignee: Thomson-CSF, Paris, France

[21] Appl. No.: 861,726

[22] Filed: May 12, 1986

[30] Foreign Application Priority Data

May 15, 1985 [FR] France ............................ 85 07400

[51] Int. Cl.⁴ .............................................. H03B 7/14
[52] U.S. Cl. ................................ 331/96; 331/107 DP
[58] Field of Search .............. 331/96, 107 DP, 107 G, 331/117 D

[56] References Cited

U.S. PATENT DOCUMENTS

| 3,803,513 | 4/1974 | Oya et al. ................ 331/107 DP |
| 3,866,144 | 2/1975 | Sawayama et al. ........... 331/107 G |
| 4,008,446 | 2/1977 | Hirai ................................ 331/96 |

FOREIGN PATENT DOCUMENTS

| 0053945 | 6/1982 | European Pat. Off. . |
| 2463538 | 2/1981 | France . |
| 0057852 | 5/1979 | Japan ........................... 331/107 DP |
| 0114008 | 9/1980 | Japan ........................... 331/107 DP |

OTHER PUBLICATIONS

Electronics Letters, vol. 11, No. 17, 21 about 1975, pp. 405-406, R. Knochel et al.: "Design of Cavity-Stabilised Microwave Oscillators".

Primary Examiner—Eugene R. LaRoche
Assistant Examiner—David Mis
Attorney, Agent, or Firm—Oblon, Fisher, Spivak, McClelland & Maier

[57] ABSTRACT

The invention concerns a negative resistance hyperfrequency oscillator, operating in the millimetric band, comprising a waveguide delimited on one side by an iris and a useful load and on the other side by a supplementary load, wherein a Gunn or Impatt diode is polarized and coupled to the waveguide by means of an aerial, the resonator cavity of this oscillator being delimited by the iris and by a dielectric resonator placed in the waveguide between the aerial and the supplementary load, and double coupling being provided between the resonator and the guide and between the diode to the guide to produce a stable and relatively noiseless oscillator. The invention can be applied to hyperfrequency systems, for synchronizing hyperfrequency sources and conjugating their power.

11 Claims, 3 Drawing Figures

HYPERFREQUENCY OSCILLATOR OPERATING IN THE MILLIMETRIC BAND

BACKGROUND OF THE INVENTION

1. Field of the Invention

The present invention concerns a waveguide oscillator, the active element of which is a negative resistance semiconductor device, such as a Gunn or Impatt diode. This diode is intended to operate in frequency ranges known as millimetric frequencies, i.e. in the 30-300 GHz band. It is stabilized by a dielectric resonator, coupled to the waveguide so that the cavity obtained operates in a monomode manner. The oscillator according to the invention is particularly stable with respect to temperature variations and generates little noise.

Millimetric band power supplies,—i.e. supplies the wavelength of which is comprised between 1 cm and 1 mm—having good stability in frequency and good noise characteristics can only be provided in the form of a stable source including a Gunn or Impatt diode. The stability and noise characteristics of the power supply are those of the synchronizing oscillator. It is therefore an object of the invention to propose a stable and relatively noiseless oscillator.

BRIEF DESCRIPTION OF THE PRIOR ART

Extremely stable and relatively noiseless oscillators are known, but they operate at lower frequencies X-band: 6.2-10.9 GHz and Ku-band 17.2-33 GHz) than that concerned by the oscillator according to the invention, i.e. 94 GHz. These oscillators are produced on a planar substrate supporting the microstrip lines, to which are coupled one or several dielectric resonators in the form of spheres, cylinders or parallelepipeds formed of rutile or yttrium garnet, for example. The temperature coefficient of the dielectric resonator can be optimized in order to minimize the variations of frequency with the variation of temperature. Furthermore, the overvoltage coefficient $Q_{ext}$ is high, thereby contributing to the improvement in reducing the noise of the oscillator.

A millimetric oscillator stabilized at 50 GHz by a dielectric resonator has been described in the article "50 GHz IC Components Using Alumina Substrates" published in IEEE Trans. on Microwaves Theory and Techniques, vol. MTT 31, No. 2, Feb. 83, pages 121 to 128. But the dielectric resonator is coupled to a microband line.

It appears that 50 GHz constitutes an upper limit for planar oscillators on alumina substrates, stabilized by a dielectric resonator, and no known publication describes a resonator oscillator operating above 50 GHz.

Oscillators operating at higher frequencies have up to now been produced in the form of waveguides, such as that which is schematically represented in FIG. 1.

A waveguide 1 comprises a double T-piece 2 and 3, these two pieces being facing each other. The T-piece 2 allows to position in the wave guide a diode 4, mounted and sealed on a base plate 6; a resonant metal disk 5 acts as impedance adapter; the diameter of this metallic disk is equal to λ/4. Through the T-piece 3 passes an aerial 7 which, by bearing upon the diode 4 through the intermediary of the disk 5 provides a polarizing voltage. The aerial 7 is maintained and isolated by means of one or several absorbing loads 8.

This oscillator is frequency controlled by means of a piston 9, that can be displaced in the waveguide, and which provides a short-circuit for the waves. The oscillator according to the invention has a cavity, which operates in a monomode manner. The double coupling of the diode and the guide and of the resonator and the guide is utilized in order to provide an oscillator that is stable in frequency and temperature, generates little noise and furthermore is compact.

SUMMARY OF THE INVENTION

More specifically, the oscillator according to the invention is a hyperfrequency oscillator, operating in the millimetric band, comprising a wave guide closed at a first end by an iris diaphragm and by a useful load impedance and at a second end by a supplementary load impedance and also comprising a negative resistance semiconductor element, electrically polarized by means of an antenna or aerial that couples the semiconductor element to the waveguide, said oscillator further comprising a resonator cavity in the waveguide, delimited by the iris diaphragm, and a dielectric resonator, placed in the waveguide at a location between the aerial coupling the semiconductor element and to the supplementary load.

BRIEF DESCRIPTION OF THE DRAWINGS

The present invention will appear more clearly apparent from the following description, illustrating the advantages of said oscillator, and referring to the appended figures wherein.

DETAILED DESCRIPTION OF THE DRAWINGS

Figure 1:
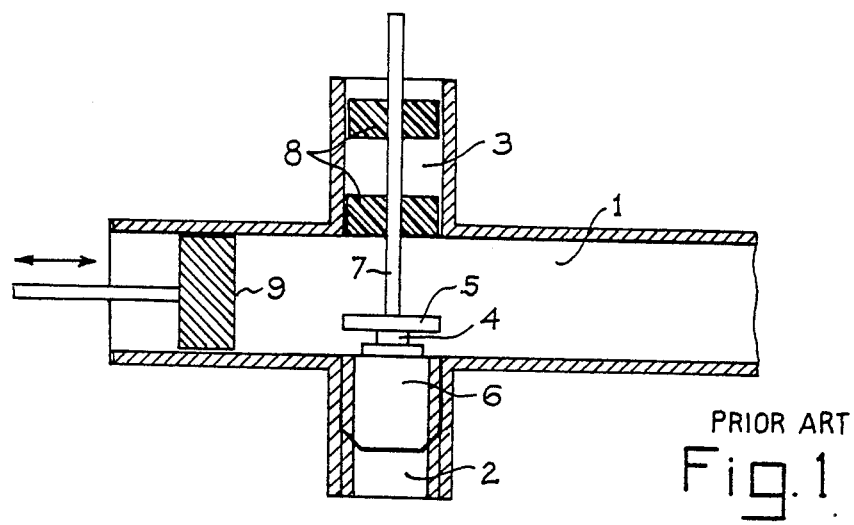
FIG. 1 is a simplified diagram of a known waveguide oscillator, with a radial so-called "cape" cavity, as described herein-above.
Figure 3:
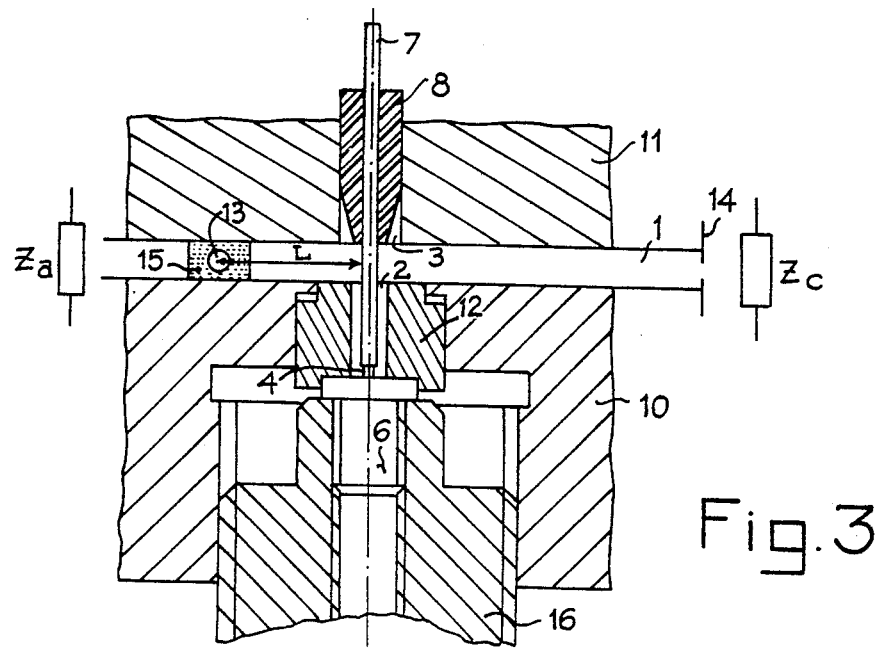
FIG. 3 shows a cross-sectional view of the resonator cavity of the oscillator according to the invention.

In order to facilitate understanding of the invention, the same references designate the same items in FIG. 1 of the prior art and in FIG. 3 representing an oscillator according to the invention, insofar as such items are common to the prior art and to the invention.

Figure 2:
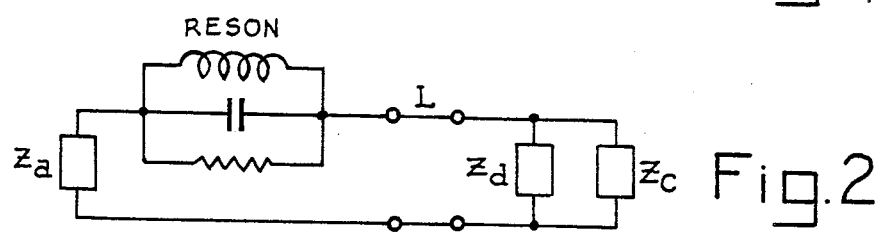
FIG. 2 is a wiring diagram of the oscillator according to the invention.

FIG. 2 represents the wiring diagram of the dielectric resonator oscillator. The active element of this oscillator is a Gunn or Impatt diode, manufactured from materials belonging to group III-V such as for example GaAs or InP, or other tertiary or quaternary alloys; it has an impedance $Z_d$ as defined in the coupling plane of the waveguide. This diode is introduced into the waveguide, the resonator cavity being defined by an iris diaphragm (not represented) on the side of the useful load $Z_c$ and by a dielectric resonator, represented by its equivalent diagram of RLC connected in parallel. A supplementary absorbing load $Z_a$ is provided to the rear of the dielectric resonator.

The dielectric resonator which is placed in the waveguide at a controllable location—whereby the distance L between the resonator and the diode can be varied—is so positioned that at the resonance frequency it is equivalent to a load of high reflection coefficient; it reflects a maximum of power. The supplementary load $Z_a$, located in the waveguide on the same side as the resonator with respect to the diode, allows to ensure that furthermore, apart from the resonance, the conditions of oscillation are not satisfied. Furthermore, the iris diaphragm located between the diode and the useful load $Z_c$, can be obtained in different ways known to those skilled in the art; the iris modifies the output impedance of the waveguide in order to extract maximum power and it modifies the susceptance defined on the active element so that the oscillation frequency coincides with the natural frequency of the dielectric resonator.

Thus in this millimetric band oscillator stabilized by a dielectric resonator, the resonator utilized in fundamental mode is coupled with the waveguide and furthermore magnetic coupling of the diode the waveguide is provided. A waveguide oscillator can be coupled either in the fundamental mode, or in a higher mode, according to the selected adjustment. In the present case, the resonator is placed in the waveguide so that its coupling with the waveguide corresponds to the desired mode, i.e. the fundamental mode.

This type of system is equivalent to that obtained with a metallic resonator cavity; but the oscillator according to the invention has the advantage of operating in a monomode manner, whereas a metallic resonator cavity system, i.e. comprising a short-circuit instead of the dielectric resonator plus supplementary load system operates in a multimode manner. Furthermore, the coefficient of overvoltage $Q_{ext}$ is higher than that obtained conventionally with a "cape" cavity whereby the noise level B is improved.

FIG. 3 is a cross-sectional view of the resonator cavity of the oscillator according to the invention. This figure has been simplified, and it is limited to a single zone of the system that is adjacent to the diode and the resonator, since in fact the waveguide and the useful and supplementary loads $Z_c$ and $Z_a$ have dimensions that are not compatible with this figure, at least for the same scale.

The description of this figure allows to specify more clearly herein-after certain of the features and advantages of the oscillator according to the invention.

A waveguide 1 is formed between two metallic blocks 10 and 11, made of gold-plated copper for example, one of the two blocks comprising a machined groove in order to form the waveguide 1. Block 10 is provided with a cylindrical orifice 2 forming a tee with the waveguide 1, block 11 has another cylindrical orifice 3 forming a tee with the guide, the two orifices 2 and 3 being aligned facing each other, on the same axis.

The active element, i.e. the diode 4, mounted and sealed on a base plate 6 then screwed on a sink 16 is positioned in the block 10 at the end of a coaxial rod 7, which feeds the polarizing voltage to the diode. The diode 4 being separated from the axis of the waveguide 1 by a spacer ring 12, the metallic rod 7 acts as an aerial and is coupled to the magnetic field of the waveguide. The other end of this aerial 7 comprises an absorbing load 8.

A dielectric resonator 13 is placed in the waveguide 1, between the central conductor or aerial 7 and a supplementary load indicated at $Z_a$.

An iris 14, introduced into the waveguide 1 between the central conductor 7 and the useful load $Z_c$, optimizes the output power and modifies the susceptance as defined on the active element, so that its oscillation frequency coincides with the natural resonance frequency of the dielectric resonator.

It is understood that the diode 4 is a diode able to oscillate at hyperfrequencies, at least at 94 GHz in the particular application envisaged, but, more generally, at frequencies of up to 300 GHz. The diode used is either a Gunn diode made of GaAs—or of other similar materials, such as GaAlAs—that operates in an harmonic mode in the millimetric band, or a Gunn diode made of InP, which operates in a fundamental mode. But, whatever the mode of oscillator of the diode, the operating of the cavity delimited by the dielectric resonator and the iris is monomode.

The dielectric resonator 13 is constituted by a sphere, a cylinder or a parallelepiped made of a known dielectric material adapted to this use, such as for example $Al_2O_3$, baryum titanate $TiO_4Ba$ or zirconium and tin titanate $(Zr, Sn) TiO_4$. The resonator, having smaller dimensions than those of the waveguide 1, is maintained on the axis of the guide by means of a material 15 that is not subject to hyperfrequency losses.

By way of non-limitative example, at 94 GHz and for a waveguide having an internal thickness of 2.54 mm, a cylindrical resonator 13 has a diameter equal to 0.53 mm and a length comprised between 0.29 and 0.32 mm.

The resonator is centered on the longitudinal axis of the waveguide 1. In fact, it must not be too close to a wall of the waveguide, otherwise its coefficient of quality degrades, which means that the oscillation frequency changes and will no longer be tuned to the exact frequency, but rather corresponds to a spectrum of frequencies.

The dielectric resonator 13 is furthermore closer to the diode, or more precisely to the antenna 7 than the short-circuit 9 in an oscillator according to the prior art. This means that the frequency shift as a function of temperature is lower than that obtained with an oscillator having a metallic cavity determined by a short-circuit. Furthermore, this frequency shift, partially due to the dilatation of the waveguide that causes to vary the resonator-antenna length L, can be compensated by selecting for the resonator 13 a dielectric material the temperature coefficient of which cancels or at least opposes the dilatation effect of the waveguide.

The zirconium and tin titanate can, for example, have a positive temperature coefficient of 3 ppm/°C., which ensures good stability of frequency within a range of 60° C.

The negative resistance hyperfrequency oscillator according to the invention is used in hyperfrequency system requiring a certain power obtained from a plurality of sources synchronized by a stable oscillator and producing relatively little noise. It is furthermore extremely compact. It is applied to systems such as radars, hertz beams, spatial telecommunications or optical fibers.

We claim:

1. Hyperfrequency oscillator, operating in the millimetric band, comprising a wave guide closed at a first end by an iris diaphragm and by a useful load impedance and at a second end by a supplementary load impedance and also comprising a negative resistance semiconductor element, electrically polarized by means of an aerial that couples the semiconductor element to the waveguide, said oscillator further comprising a resonator cavity, in the waveguide, delimited by the iris diaphragm and by a dielectric resonator placed in the waveguide at a location between the aerial that couples the semiconductor element and the supplementary load.

2. Oscillator according to claim 1, wherein the negative resistance semiconductor element is a hyperfrequency diode of the Gunn or Impatt type.

3. Oscillator according to claim 2, wherein the dielectric resonator is placed in the waveguide at such a distance from the aerial that at the resonance frequency it is equivalent to a load of high reflection coefficient.

4. Oscillator according to claim 2, wherein the waveguide is arranged in double coupling with the diode and the resonator.

5. Oscillator according to claim 4, wherein the coupling of the resonator with the waveguide uses the fundamental mode of the resonator.

6. Oscillator according to claim 1, wherein the dielectric resonator has the shape of a sphere, cylinder or parallelepiped.

7. Oscillator according to claim 1, wherein the dielectric resonator is maintained in position, on the axis of the waveguide by means of a material that is not subject to absorption under hyperfrequency conditions.

8. Oscillator according to claim 1, wherein the dielectric resonator is made of a material such as alumina, barium titanate, zirconium and tin titanate, having a high overvoltage coefficient.

9. Oscillator according to claim 8, wherein the material of the dielectric resonator is selected so as to compensate the frequency shift as a function of temperature.

10. Oscillator according to claim 2, wherein the iris modifies the susceptance as defined on the diode so that the oscillation frequency coincides with the natural resonance frequency of the dielectric resonator.

11. Oscillator according to claim 10, wherein the operation of the cavity thus delimited is of the monomode type as opposed to the multimode operation of a metallic cavity.

* * * * *